United States Patent [19]

Schittenhelm et al.

[11] Patent Number: 5,267,445
[45] Date of Patent: Dec. 7, 1993

[54] CRYOMAGNET SYSTEM WITH A LOW-LOSS HELIUM CRYOSTAT OF MINIMIZED DISTURBANCES

[75] Inventors: Werner Schittenhelm, Westford; Charles Martin, Arlington, both of Mass.; Beat Weber, Spreitenbach; Beat Mraz, Hombrechtikon, both of Switzerland

[73] Assignee: Spectrospin AG, Switzerland

[21] Appl. No.: 839,966

[22] Filed: Feb. 21, 1992

[30] Foreign Application Priority Data

Feb. 27, 1991 [DE] Fed. Rep. of Germany ........ 4106135

[51] Int. Cl.[5] ............................................. F17C 7/04
[52] U.S. Cl. ....................................... 62/48.1; 62/51.1
[58] Field of Search ........................ 62/48.1, 46.3, 51.1

[56] References Cited

U.S. PATENT DOCUMENTS

| | | | |
|---|---|---|---|
| 3,298,187 | 1/1967 | Short | 62/48.1 |
| 3,827,246 | 8/1974 | Moen et al. | 62/48.1 |
| 3,866,785 | 2/1975 | Conte | 62/48.1 |
| 3,967,465 | 7/1976 | Asselman et al. | 62/46.3 |
| 4,259,846 | 4/1981 | Rudolph et al. | 62/46.3 |
| 4,350,017 | 9/1982 | Kneip et al. | 62/48.1 |

FOREIGN PATENT DOCUMENTS

| | | |
|---|---|---|
| 1528919 | 5/1964 | Fed. Rep. of Germany . |
| 1551360 | 1/1967 | Fed. Rep. of Germany . |
| 3153405 | 4/1981 | Fed. Rep. of Germany . |

Primary Examiner—Ronald C. Capossela
Attorney, Agent, or Firm—Walter A. Hackler

[57] ABSTRACT

A cryomagnet system, in particular for use with nuclear magnetic resonance (NMR) experiments or ion cyclotron resonance (ICR) experiments, with a low-loss helium cryostat (1) comprising a helium container (2) and one or a plurality of tubes for the feed or exit of helium into or out of the helium container (2), respectively, the tubes being sealed to the atmosphere outside the helium container (2) by at least one non-return low-pressure valve (4), wherein at least one exhaust pipeline (3) is provided with a device for dissipating the energy of the expanding helium. Such a device may consist of a chamber which is deviated from the exhaust pipeline (3) and has a wall material of very high extensibility, e.g. a folding balloon. Yet the device may also consist of a flow baffle which is provided in the exhaust pipeline (3), for example a porous disc (6). The device withdraws kinetic energy from thermo-acoustic oscillations of the helium gas column in the conduit system of the cryostat and thus dampens the detrimental oscillations which entrain increased losses of helium and disturbance of the magnetic field at the locus of the sample (FIG. 3a).

13 Claims, 3 Drawing Sheets

CRYOMAGNET SYSTEM WITH A LOW-LOSS HELIUM CRYOSTAT OF MINIMIZED DISTURBANCES

BACKGROUND AND SUMMARY OF THE INVENTION

The invention relates to a cryomagnet system, in particular for use with nuclear magnetic resonance (NMR) experiments or ion cyclotron resonance (ICR) experiments, with a low-loss helium cryostat comprising a helium container and one or a plurality of tubes with thin walls for the suspension the helium container and the feed or exit of helium into or out of the helium container, respectively, the tubes being sealed to the atmosphere outside the helium container by at least one non-return low-pressure valve.

Such a cryomagnet system is for example known from the German Patent 31 53 405.

Nowadays, in particular cryomagnet systems for NMR spectrometry are cooled by extremely low-loss helium cryostats which have a loss-rate of the liquid helium of only 10 ml/h and below. Yet with such a low-loss cryostat of conventional construction the actually observed losses of helium are higher than the ones theoretically calculated, because at these low-loss rates even loss sources which could normally be neglected become already noticeable.

Another problem with the mentioned conventional cryomagnet systems are disturbances of the magnetic field generated at the locus of the sample to be examined, said disturbances obviously arise within the cryomagnet system. Whereas external disturbing influences such as electromagnetic interference fields as well as forced mechanical vibrations of the system can be shielded and/or compensated by means of extensive measures, disturbing side bands and/or broadening of the lines in the NMR signals can still be observed which are only due to internal disturbing influences.

Therefore it is an object of the present invention to provide a cryomagnet system in which the losses of helium are reduced to the theoretical limit and at the same time internal perturbations of the magnetic field generated at the locus of the sample are minimized to a great extend.

This object is solved by the present invention in that at least one exhaust pipeline is provided with a device for dissipating the energy of the expanding helium.

SUMMARY OF THE INVENTION

In the cryomagnet system according to the present invention the thermally driven acoustic oscillations of the helium gas in the conduit tube system are prevented or at least highly damped by means of the dissipation device which is provided in or at the conduit tubes. Such acoustic oscillations, the frequencies of which are within the range of about 10 to 100 Hz, can be incited in conventional low-loss cryostats, because the conduits towards the helium container have to be sealed against the atmosphere outside the helium container by a non-return low-pressure valve which opens at a very low over-pressure in the helium container (e.g. 5 to 10 mbar). It is thus prevented that with an increasing external air pressure humid air can penetrate the cryomagnet system and cause icings in the helium conduit. Yet, on the other hand by this a closed resonable volume is created, the propensity of said volume for oscillating is much greater than it would be with a system having open supply conduits. The incitation of such oscillations is highly favored by the relatively high difference in temperature within the conduit system, said difference in temperature arises between the parts of the conduits immediately adjacent to the helium container and the parts of the conduits being spaced from the helium container.

The pressure thrusts caused by these acoustic oscillations of the helium gas result in a considerable increase of the damping losses of the helium on the one hand, but on the other hand also in mechanical oscillations within the range of 10 to 100 Hz within the cryostat system, so that a relative movement between the magnetic field produced by the cryomagnet and the sample can arise. Then, the sample is subjected to a periodic field change (=field modulation), which in the case of NMR spectra can lead to disturbing side bands in distances of 10 to 100 Hz and with intensities of several percentages of the actual measuring signal.

But the appearance of these modulations can also result from the fact that metallic surfaces having thin walls (preferably between the cryomagnet and the sample) become moved relative to the cryomagnet, whereby eddy currents are incited in them, said eddy currents in turn can lead to field changes at the locus of the sample.

A particular advantage of the cryomagnet system according to the invention is that the losses of helium of the cryostat are at the same time further reduced, as well as the internal formation of electromagnetic interference fields in the cryomagnet system is minimized by one single measure, i.e. the suppression or damping of thermo-acoustic oscillations of the helium gas in the conduit system by means of the device for dissipating the energy of the expanding helium, so that finally a higher stability of the produced magnetic field is achieved in lower-loss operation of the cryomagnet system.

In an embodiment of the cryomagnet system according to the invention the device for dissipating the energy of the expanding helium consists of a chamber deviated from an exhaust pipeline having a wall material which is highly elastic and has a very low spring constant. Due to a pressure thrust the chamber will inflate. Thereby the energy of the thermo-acoustic oscillation in the helium is at least partly passed on to the inflating walls of the chamber, transferred into friction energy and thus withdrawn from the gas, whereby the oscillation is damped.

In a further embodiment of the invention the chamber is formed by expansion bellows with thin walls. Such expansion bellows are usually very lasting and would burst only due to considerably higher pressure thrusts than e.g. a rubber balloon would. Therefore when using expansion bellows, it is not necessary to change them often.

In another embodiment of the invention the device for dissipating the energy of the expanding helium comprises a flow baffle arranged in the exhaust pipeline. It serves as an impediment for the flowing gas, so that the kinetic energy of the thermo-acoustic oscillation is transferred to the surroundings due to gas friction at the surface of the baffle and due to turbulences of the gas flow. The thermo-acoustic oscillation can also be damped by the dissipation of the kinetic energy of the helium expanding in the conduit tube.

In a development of this embodiment the flow baffle is formed by at least one porous disc arranged in the conduit tube of the exhaust pipeline. From the helium gas penetrating through the capillar canals of the disc material energy is also withdrawn due to the resulting gas friction, a fact that is here also used for damping the thermo-acoustic oscillations. Such a porous disc may be of synthetic material, having the advantage of a cheap and simple production. In another embodiment the porous disc consists of sintered material, in particular sintered bronze and can be obtained from pneumatic noise-absorbers common in trade.

Preferably the porous disc is arranged at one end of the exhaust pipeline looking away from the helium container before the non-return low-pressure valve, because at the end of the tube the damping is especially effective. In a particularly preferred embodiment an intermediate chamber with a greater inner diameter than the inner diameter of the conduit tube is provided. Thus free flowing of the gas through the porous disc is guaranteed, because due to the increase in volume by means of the intermediate chamber the build-up of a counter-pressure in the gas is prevented on side of the porous disc facing away from the non-return low-pressure valve.

Preferably the devices for dissipating the energy of the expanding helium are provided symmetrically at all exhaust pipelines. This results in a symmetrical energy-absorption over the whole exhausting system. In particular different conditions as to flow, temperature and pressure in the exhaust pipelines are avoided, making it possible that the helium is vaporized in a low and steady manner.

Due to the fact that normally these exhaust pipelines also serve for the suspension of the helium container at the same time different thermical changes of the length in the suspensions and the thus produced local displacement of the cryomagnet relative to the sample can be prevented by means of the above measure. Such a displacement would be very undesirable, because it would entrain a change of the value and a deterioration of the homogeneity of the magnetic field generated at the locus of the sample.

With an especially simple embodiment all exhaust pipelines are in contact with one another by at least one communicating tube, so that only one single device for dissipating the energy of the expanding helium at or in the communicating tube is necessary. As well, only one single over-pressure valve is necessary which is also mounted on the communicating tube.

The invention will be described and explained hereafter in more detail with reference to the embodiments illustrated in the drawing. The features that can be derived from the description and the drawing may be used in other embodiments of the invention each individually or in any combination thereof.

DESCRIPTION OF THE PREFERRED EMBODIMENT(S)

Figure 1:
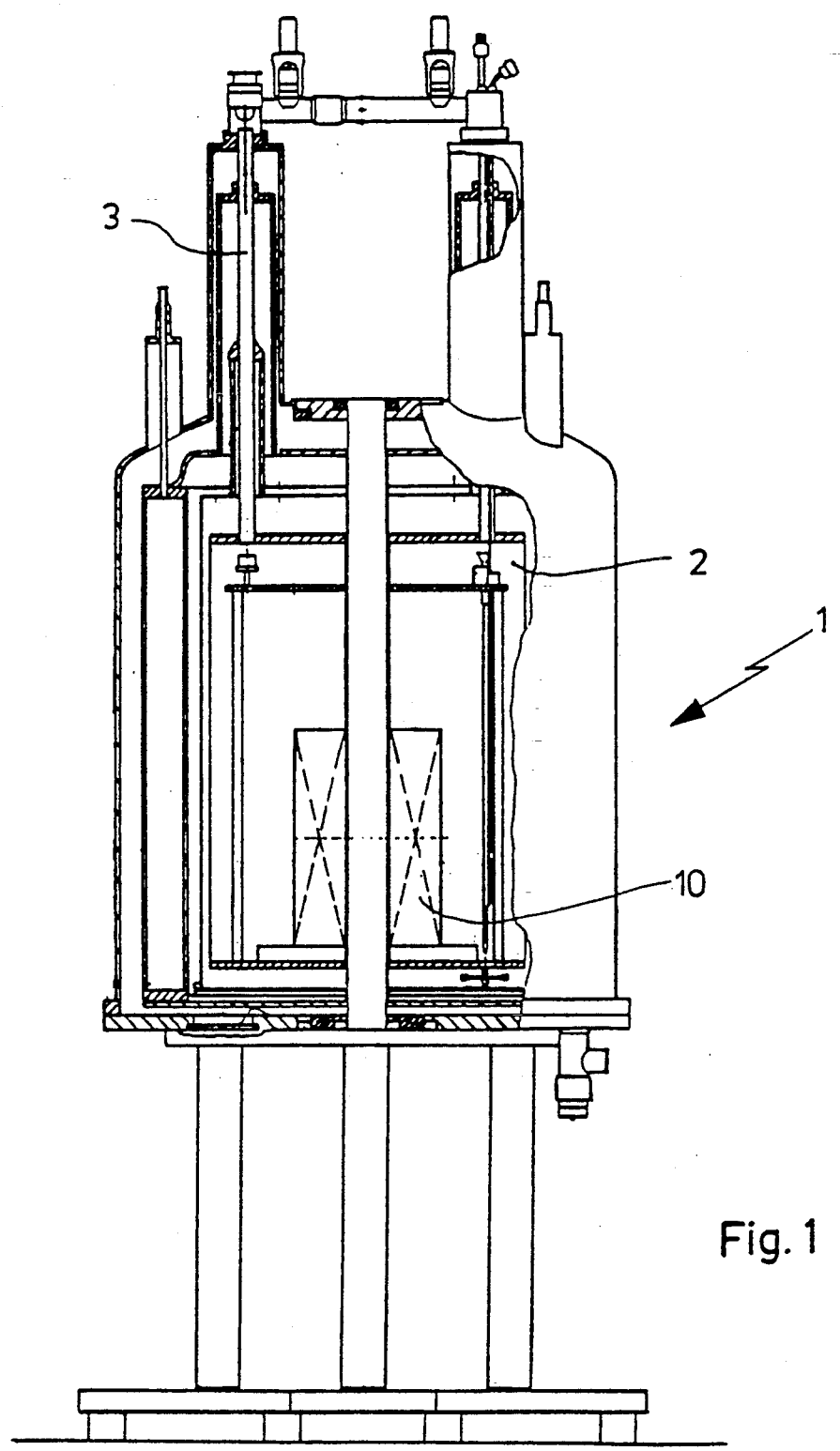
FIG. 1 shows a part-section cut through a cryomagnet system with a magnet coil in a helium container.

The cryomagnet system shown in FIG. 1 comprises a helium cryostat 1 with a helium container 2, in the interior of said helium container the magnet coil 10 is provided. Such magnet systems are particularly used in NMR experiments when extremely high and utmost homogenous magnetic fields have to be generated by a superconducting magnet coil. In ICR experiments, too, similar cryomagnet systems are used in which the helium container 2 is also suspended from two tubes having thin walls, yet the cryomagnet is installed in a lying position and generates a horizontally orientated magnetic field. In this case as well the same considerations apply as for the above mentioned NMR cryomagnet system. The liquid helium which is necessary for cooling the superconduction magnet coil 10 is a quite considerable cost factor for the operation of such a system. Therefore, one has endeavoured for quite a time to maintain the loss-rates of liquid helium as low as possible by means of various insulations and other constructional measures. Typical low-loss cryostats for NMR spectrometers have a loss-rate of liquid helium in the range of 10 ml/h. The vaporizing helium leaves the helium container 2 via one or a plurality of exhaust pipelines 3, at the end of said pipelines 3 it either enters the atmosphere or is collected to be used again.

Figure 2:
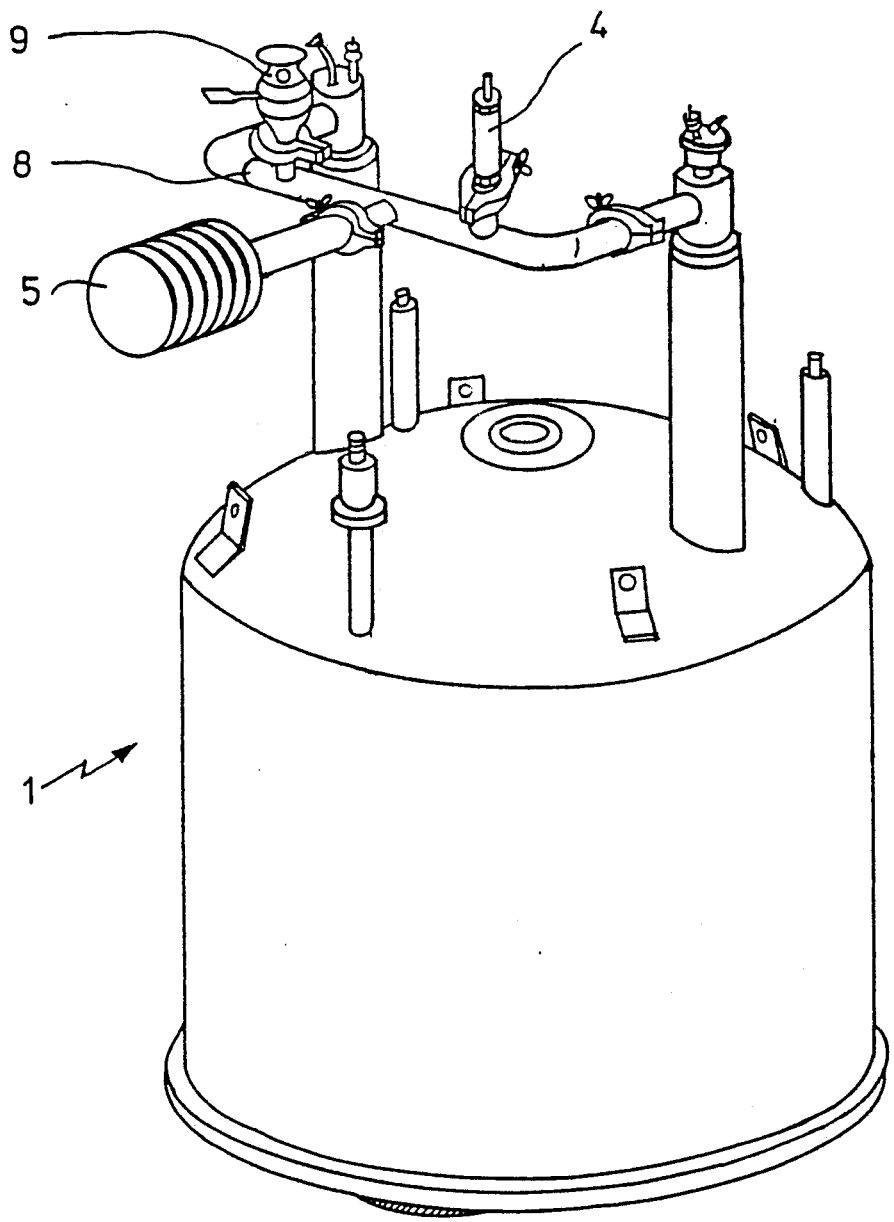
FIG. 2 shows a three-dimensional representation of the cryomagnet system according to the invention with expansion bellows for dissipating the energy of the expanding helium.

In a low-loss cryostat the replenishing and exhaust pipelines 3 have to be sealed against the outer atmosphere by means of one or a plurality of non-return low-pressure valves 4 which open at about 5 to 10 mbar in order to prevent that with increasing outer air pressure humid air can cause icings in the filling conduit system towards the cryostat. Such a non-return low-pressure valve 4 is shown in FIG. 2, for example.

In the locked volume of such a low-loss cryostat thermally driven acoustic oscillations can now be built up in the exhaust pipelines 3 owing to the differences in temperature between the parts being in contact with the liquid helium and the parts of the system having room temperature. These oscillations of the helium gas in the conduit system lead on the one hand to a considerable increase of the loss-rate of the helium of the cryostat. On the other hand, they incite mechanical oscillations of the walls and of other metallic parts of the cryostat. As described above, this results on the one hand in relative movements between the sample and the magnetic field generated by the magnet coil 10, on the other hand eddy currents are set in motion in the metallic surfaces having tin walls between the magnet coil 10 and the sample, leading to time dependent changes of the magnetic field at the locus of the sample. Owing to this fact, with NMR spectrometers undesired side bands are produced in the spin resonance spectrum, said side bands entrain an adulteration of the measured spectrum.

The increased loss of helium as well as the disturbing field modulation mentioned can be avoided if the source of the disturbances, i.e. the thermically driven acoustic oscillations, are eliminated or at least minimized. This is performed according to the invention by damping the thermo-acoustic oscillations by means of a device for dissipating the energy of the expanding helium in the exhaust pipelines 3.

A concrete design of such a device is realized in a chamber deviated from an exhaust pipeline 3, the wall material of said pipeline has high extensibility and ductility up to near of the plastic range with small a spring constant. A simple embodiment of such a chamber are expansion bellows 5 with thin walls shown in FIG. 2.

As a result at least part of the energy from the thermo-acoustic oscillation of the helium gas is transferred to the wall material of the chamber which extends due to the thrust pressure and thus withdrawn from the oscillation, leading to a damping of the oscillation. The easy ductility of the chamber walls is important, so that the chamber can fully expand at the existing low over-pressure of only about 5 to 10 mbar.

Another possibility of realizing a device for dissipating the energy of the expanding helium and for damping the thermo-acoustic oscillations is to integrate one or a plurality of flow baffles into the system of exhaust pipelines 3. The flow baffles serve as impediments for the gas flow, enforce production of turbulences or produce gas friction, the energy being taken from the oscillating gas volume.

Figure 3A:
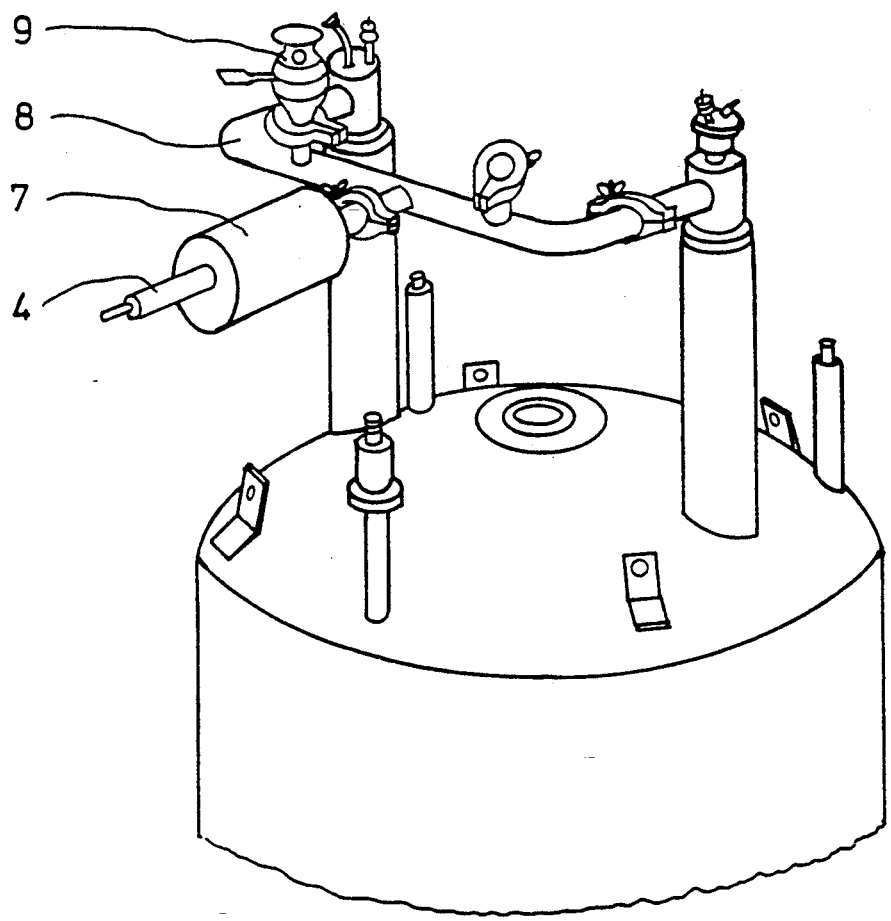
FIG. 3a shows a three-dimensional representation of the upper part of a helium cryostat according to the invention with connected exhaust pipelines and a flanged intermediate container with a flow baffle.
Figure 3B:
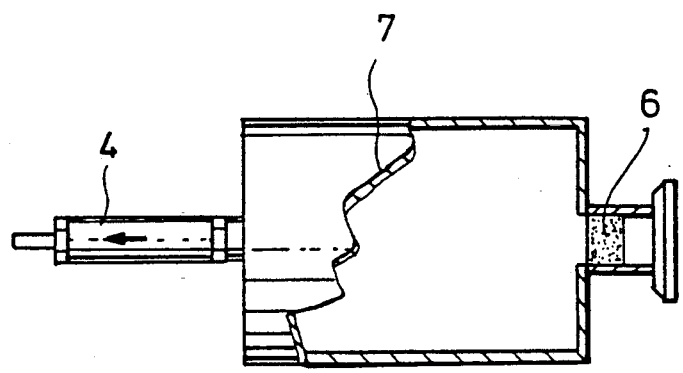
FIG. 3b shows a partly cut view in detail of the intermediate chamber with a porous disc as stream baffle.

A possible form of such flow baffles is indicated in FIG. 3b, showing a porous disc 6 arranged in the conduit. In the example shown the porous disc 6 is arranged before an intermediate chamber 7 containing a volume which ends on the opposite side in a non-return low-pressure valve 4. Due to gas friction in the capillar canals of the porous disc kinetic energy is withdrawn from the helium gas penetrating through the porous disc 6, in particular in case of a thermo-acoustic oscillation. The voluminous intermediate chamber 7 ensures free flowing of the gas through the porous disc 6 by preventing that a counter-pressure is built up on the side of the disc facing the non-return low-pressure valve 4.

The porous disc 6 can be made of cheap synthetic material or of sintered material, especially sintered bronze and be taken from pneumatic noise absorbers common in trade.

In order to achieve a steady vaporization of the helium gas and to avoid an asymmetrical absorption of energy in the individual exhaust pipelines 3, which would lead to different conditions as to pressure and temperature in the exhaust pipelines 3 and thus to mechanical stress with damaging effects on the homogeneity of the magnetic field, it is advantageous to provide the devices for dissipating energy in a symmetrical way and the same number at all exhaust pipelines 3.

The same effect is achieved if all exhaust pipelines 3 are in contact with one another by at least one connecting tube 8. In this case, as shown in FIG. 2 and FIG. 3a, only one device for dissipating energy of the expanding helium, which is provided at or in the connecting tube 8, may be sufficient for an effective damping of oscillations.

In case of a build-up of a higher helium over-pressure of more than about 8 mbar normal in operation, as may for example occur with quenching and sudden heating of the superconducting magnet coil 10 and thus of the liquid helium surrounding it, normally a safety valve, often in form of a bursting disc 9, is provided at the vaporizing system in order to avoid an explosion of the cryomagnet system. If the expansion bellows with thin walls shown in FIG. 2 which do not resist an over-pressure considerably greater than the one usual in operation and which burst especially in case of a pressure thrust due to quenching the superconducting magnet coil 10, are used, the bursting disc 9, too, can in principle be left out.

What is claimed is:

1. Cryomagnet system suitable for use with nuclear magnetic resonance (NMR) experiments and ion cyclotron resonance (ICR) experiments, with a low-loss helium cyrostat, said cryomagnet system comprising a helium container and at least one tube means for suspending the helium container and for feeding and exiting helium into and out of the helium container, respectively, the tube means being sealed to the atmosphere outside the helium container by at least one non-return low-pressure valve, the cryomagnet system further comprising device means, having an expandable volume, and at least one exhaust pipeline connected between said device means and said helium container, for enabling the helium gas to exert pressure on the device means in order to expand the expandable volume for dissipating helium gas energy.

2. Cryomagnet system according to claim 1, wherein the device means for dissipating the energy of the expanding helium comprises a chamber interconnected with the exhaust pipeline, said chamber having a wall material with high extensibility and a very low spring constant.

3. Cryomagnet system according to claim 2, wherein the chamber comprises expansion bellows.

4. Cryomagnet system according to claim 1, wherein the device means for dissipating the energy of the expanding helium is disposed symmetrically at all exhaust pipelines.

5. Cryomagnet system according to claim 1, wherein all exhaust pipelines are in contact with one another by at least one connecting tube and wherein only one device means for dissipating the energy of the expanding helium is provided in the connecting tube, respectively.

6. Cryomagnet system suitable for use with nuclear magnetic resonance (NMR) experiments and ion cyclotron resonance (ICR) experiments, with a low-loss helium cryostat, said cryomagnet system comprising a helium container and at least one tube means for suspending the helium container and for feeding and exiting helium into and out of the helium container, respectively, the tube means being sealed to the atmosphere outside the helium container by at least one non-return low-pressure valve, said helium expanding in the exhaust pipeline exterior to the helium container, and
  at least one exhaust pipeline having device means for dissipating energy of the expanding helium, said device means for dissipating the energy of the expanding helium comprising a flow baffle disposed in the exhaust pipeline.

7. Cryomagnet system according to claim 6, wherein the flow baffle is formed by at least one porous disc disposed in a conduit tube of the exhaust pipeline.

8. Cryomagnet system according to claim 7, wherein the porous disc is made of synthetic material.

9. Cryomagnet system according to claim 8, wherein the porous disc is arranged at one end of the exhaust pipeline downstream from the helium container and upstream from the non-return low-pressure valve (4).

10. Cryomagnet system according to claim 7, wherein the porous disc is made of sintered material.

11. Cryomagnet system according to claim 10, wherein the porous disc is sintered bronze and is disposed at one end of the exhaust pipeline downstream from the helium container and upstream from the return low-pressure valve.

12. Cryomagnet system according to claim 7, wherein the porous disc is disposed at one end of the exhaust pipeline downstream from the helium container and upstream the non-return low-pressure valve.

13. Cryomagnet system according to claim 12, wherein an intermediate chamber having a greater inner diameter than an inner diameter of the conduit tube is disposed between the porous disc and the non-return low-pressure valve.

* * * * *